United States Patent Office 3,231,422

Patented Jan. 25, 1966

3,231,422

METHOD FOR SURFACE TREATMENT OF SEMICONDUCTOR DEVICES OF THE JUNCTION TYPE

Reimer Emeis, Ebermannstadt, Upper Franconia, Germany, assignor to Siemens-Schuckertwerke Aktiengesellschaft, Berlin-Siemensstadt and Erlangen, Germany, a corporation of Germany No Drawing. Filed Jan. 23, 1962, Ser. No. 168,256
Claims priority, application Germany, Jan. 27, 1961, S 72,235
2 Claims. (Cl. 117—213)

My invention relates to a method of treating the surface of essentially monocrystalline p-n junction semiconductor bodies for the purpose of improving their electronic qualities, particularly their value of blocking or peak-inverse voltage.

As a rule, in the production of electronic semiconductor devices, such as rectifiers, transistors, photodiodes, four-layer junction devices such as silicon controlled rectifiers, and similar electronic semiconductor components, the unalloyed semiconductor bodies as well as the semifinished semiconductor devices are subjected to etching treatment. The purpose of this treatment is mainly to clean the surface of any adhering impurities and also to eliminate any irregularities in the crystalline texture at the surface. It is particularly necessary that the external p-n boundaries, that is those localities at which the p-n junctions, produced by diffusion or alloying, emerge at the surface of the semiconductor body, be subjected to etching in order to obtain a highest feasible blocking voltage.

The choice of the etching liquid to be employed is usually dependent upon the fundamental semiconductor material used for the production of the semiconductor device, this material consisting, for example, of germanium, silicon, or an intermetallic compound of elements from the third and fifth groups of the periodic system, such as indium antimonide InSb, indium arsenide InAs, gallium phosphide GaP, and compounds of elements from the second and sixth groups of the periodic system such as zinc oxide ZnO and cadmium telluride CdTe. The surface treatment of silicon is preferably effected, for example, by employing a mixture of 40% hydrofluoric acid and fuming nitric acid in a 1:1 ratio. A mixture of hydrofluoric acid, in 40% concentration, fuming nitric acid and acetic acid in a 1:1:1 ratio is also used as an etching liquid for silicon and other semiconductor materials. Such etching liquids are usually called "C.P.-etching solutions." Several other etching solutions are also known for such purposes, including the use of alkaline solutions, for example hot potassium hydroxide.

My invention, in a more specific aspect, relates to the above-mentioned methods of treating the surface of semiconductor devices having an essentially monocrystalline semiconductor body, with one or more p-n junctions, in which a disturbed crystal layer is eliminated from the surface of the semiconductor body by etching. Relative to such etching methods, it is an object of my invention to secure a greater uniformity and stability in the electrical qualities, particularly the blocking voltage, of the junction devices produced and to, thereby, reduce the number of rejects as well as prolong the useful lifetime of the finished semiconductor devices in a greatly increased proportion of the number of products.

To achieve these objects, and in accordance with my invention, I first subject the surface of the p-n junction semiconductor body to etching in an etching liquid, substantially in one of the known ways mentioned above, but thereafter continue the surface treatment by subjecting the etched surface to the vapors evolving from processing liquid that contain nitric acid and hydrofluoric acid as essential ingredients, such exposure being maintained until the semiconductor surface exhibits the formation of a thin layer (film) of coloration or discoloration. According to another feature of my invention, I continue such exposure of the semiconductor surface to the vapors of the processing liquid until a blue coating forms on the treated surfaces.

My invention is based upon the discovery that, with respect to the effects desired by the etching of junction semiconductor devices or bodies, it is not only essential to eliminate a disturbed crystal barrier at the surface of the body, but that the particular manner in which the etching operation is terminated, particularly where a p-n junction emerges at the semiconductor surface, is likewise of decisive importance for the blocking abilities of the semiconductor body. I have found that when the etching operation with the aid of a C.P.-etching solution was terminated abruptly, the increase in blocking voltage of the p-n junction, obtained by the etching action, was not uniform and not stable. I have further discovered, according to my invention, that a subsequent surface treatment with the vapors of the C.P.-etching solution, immediately following the etching proper, resulted in a stabilization of the properties attained. It has been observed that under the effect of these vapors, a coating is formed on the semiconductor surface exhibiting the colors of thin layers, these colors being rather indefinite and may also include irridescence or multi-color effects. I have ascertained that the stabilization of the semiconductor property attained by the etching is always reliably secured after such colors of thin layers have been formed on the semiconductor surface. Comprehensive testing and experience have shown that the improvement of the blocking qualities by such extended etching treatment is to a great extent independent of the etching liquid employed. Therefore either a C.P.-etching agent or an alkaline etching solution may be employed to dissolve the surface layers that have become disturbed or contaminated by the diffusion or alloying operation used for producing the p-n junction or junctions. In the subsequent vapor treatment according to the invention, however, it is of critical importance to employ vapors that evolve above a processing liquid consisting essentially of nitric acid and hydrofluoric acid. The vapors of potassium hydroxide are ineffective in this respect.

The invention will be further elucidated with reference to an example dealing with the fabrication of a silicon rectifier.

A high-ohmic p-type silicon disc of 12 mm. diameter and 250 micron thickness was placed upon a gold foil of the same diameter and of 50 micron thickness. The gold foil contained 0.3% of boron and thus acted as p-type dope (acceptor) when it was thereafter alloyed into the semiconductor body. A gold foil containing approximately 0.5% antimony and having a diameter of 8 mm. and 50 micron thickness was placed upon the top surface of the silicon disc. The entire assembly was embedded in powder of a substance inert with respect to the components of the assembly and was then pressed together. Thereafter the entire arrangement was heated to a temperature above the eutectic temperature of gold and silicon. As a result, the two gold foils with their doping constituents were alloyed into the silicon surface. It will be understood, however, that all numerical values relating to dimensions and percentages of constituents given above, are stated only by way of example and may be modified in accordance with the particular requirements of the semiconductor device to be produced.

The alloyed rectifier components produced in the above-described manner, exhibit the following design. On both sides of the main quantity of material in the original silicon disc unchanged by the process, were recrystallization layers respectively doped with the different doping substances previously contained in the gold foil. Located adjacent to these recrystallization zones were respective layers of a gold-silicon eutectic which contained the residues of the doping substance. There was thus formed a p-n junction constituted by the boundary between the recrystallization zone doped by antimony and having n-type conductance, on the one hand, and the originally p-type material of the semiconductor body that remained unchanged. This p-n junction emerged along a circle at the surface of the semiconductor body near the boundary of the adjacent gold-silicon eutectic.

The p-n junction body thus produced is subjected to an etching operation to remove any adhering impurities and also to eliminate disturbed surface layer. For this purpose, the body can be immersed in one of the above-mentioned etching liquids suitable for silicon. A mixture of hydrofluoric acid, in 40% concentration, and fuming nitric acid in the ratio of 1:1 is preferably used. During etching, the liquid is kept in motion relative to the body, either by means of a stirrer or by moving the semiconductor body. The etching is preferably performed on a so-called "etching centrifuge," in which the rotationally symmetrical semiconductor body is placed in rotation about its symmetry axis, and a jet of the etching liquid is directed upon the locality where the p-n junction emerges at the surface. The etching liquid is then flung off from the edge of the semiconductor disc by centrifugal force, and the residues of the etching liquid are rinsed off by a jet of water.

Immediately following the above-described etching operation by a liquid etching agent, the good blocking properties attained by the etching are stabilized by subjecting the etched surface of the above-mentioned vapors. These vapors can be directed onto the surface of the silicon disc, for example in the following manner. A spray bottle, filled only to a slight extent with the above-described processing liquid and consisting, for example, of polyethylene, is so mounted or guided that its nozzle opening passes over the semiconductor body to be treated, while a portion of the vapors contained in the spray bottle and formed above the liquid mixture of hydrofluoric and nitric acid, but not the liquid, is blown onto the semiconductor surface. After a processing time of only a few seconds, the formation of a coating on the semiconductor body can be observed, having the colors associated with layers of minute or film thickness, whereafter the vapor processing can be terminated and the semiconductor body passed to further fabrication. However, I found that the desired improvement is always achieved with reliability if the processing is continued until the formation of a blue or bluish coating is observed. As a rule, a vapor processing time in the order of 5 minutes is sufficient.

I claim:

1. The method of treating the surface of essentially monocrystalline p-n junction semiconductor bodies of silicon having a p-n junction emerging at the surface to stabilize the blocking voltage of the p-n junction, which comprises the steps of removing a disturbed crystal layer at the semiconductor surface by subjecting the body to an etching liquid containing a mixture of nitric acid and hydrofluoric acid, and then additionally exposing the etched surface to the vapors evolving from said etching liquid for a period of time sufficient to produce a change in color of the surface.

2. The method of treating the surface of essentially monocrystalline p-n junction semiconductor silicon bodies to stabilize the blocking voltage of the p-n junction, which comprises the steps of removing a disturbed crystal layer at the semiconductor surface by subjecting the body to etching liquid, and then exposing the etched surface to the vapor evolving from nitric acid and hydrofluoric acid until the body surface exhibits thin-layer discoloration with the formation of a blue coating.

References Cited by the Examiner

UNITED STATES PATENTS

| | | | |
|---|---|---|---|
| 2,740,700 | 4/1956 | Fuller | 156—17 |
| 2,930,722 | 3/1960 | Ligenza | 156—17 X |

ALEXANDER WYMAN, *Primary Examiner.*

JACOB STEINBERG, *Examiner.*